United States Patent [19]

Tanaka et al.

[11] Patent Number: 5,016,224
[45] Date of Patent: May 14, 1991

[54] SEMICONDUCTOR MEMORY DEVICE

[75] Inventors: Hiroto Tanaka, Oobu; Syuso Fujii, Kawasaki, both of Japan

[73] Assignee: Kabushiki Kaisha Toshiba, Kawasaki, Japan

[21] Appl. No.: 404,421

[22] Filed: Sep. 8, 1989

[30] Foreign Application Priority Data

Sep. 12, 1988 [JP] Japan .................................. 63-228059

[51] Int. Cl.$^5$ ............................................... G11C 7/06
[52] U.S. Cl. ................................ 365/230.03; 365/233; 365/207
[58] Field of Search ............... 365/205, 207, 208, 210, 365/230.03, 189.11, 191, 233

[56] References Cited

U.S. PATENT DOCUMENTS

| 4,366,559 | 12/1982 | Misaizu et al. | 365/208 X |
| 4,596,001 | 6/1986 | Baba | 365/207 |
| 4,807,194 | 2/1989 | Yamada et al. | 365/207 |

OTHER PUBLICATIONS

Lee et al., "A 64Kb MOS Dynamic RAM," IEEE International Solid-State Circuits Conference, Digest of Technical Papers, pp. 146-147, Feb. 1979.
Fujii et al., "A 50-uA Standby 1Mx1/256Kx4 CMOS DRAM with High-Speed Sense Amplifier," IEEE Journal of Solid-State Circuits, vol. SC-21, No. 5, pp. 643-648, Oct. 1986.

Primary Examiner—Joseph A. Popek
Attorney, Agent, or Firm—Finnegan, Henderson, Farabow, Garrett, and Dunner

[57] ABSTRACT

First sense amplifiers formed of N-channel transistors are disposed between first and second memory cell blocks. Second sense amplifiers formed of P-channel transistors are disposed between second and third memory cell blocks. Switching transistors are disposed between the sense amplifiers and the memory cell blocks in order to select a particular memory cell block in response to signals applied to the gates thereof.

14 Claims, 8 Drawing Sheets

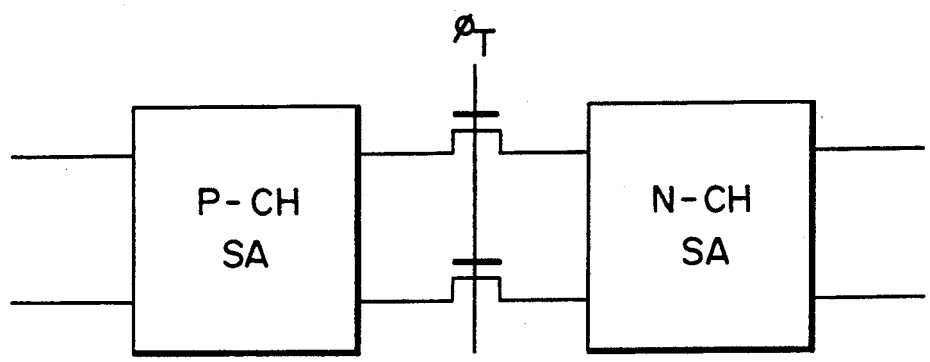
F I G. 7B

SEMICONDUCTOR MEMORY DEVICE

BACKGROUND OF THE INVENTION

1. Field of the Invention

This invention relates to a semiconductor memory, and more particularly to a dynamic memory using a shared sense amplifier.

2. Description of the Related Art

In the ordinary dynamic memory, as shown in FIG. 6, one sense amplifier SA is used for each pair of digit lines. That is, each sense amplifier SA is provided for each digit line pair. Each digit line pair includes complementary bit lines (BL and $\overline{BL}$). Data read out from a memory cell which is connected to one of bit lines BL and $\overline{BL}$ is supplied to the bit line and a potential difference between the paired bit lines is amplified by the sense amplifier.

With an increase in the integration density of the dynamic memory, memory capacitance Cs becomes smaller but bit line capacitance Cb is not reduced. As a result, the ratio Cb/Cs of bit line capacitance Cb to memory capacitance Cs becomes larger. That is, the potential difference between the paired bit lines obtained at the time of reading out memory cell data will become smaller, making it necessary to strictly set the sensitivity margin of the sense amplifier.

In order to solve the above problem, it is necessary to reduce the ratio of Cb/Cs. For this purpose, it is considered that (1) the length of the bit line is reduced to make bit line capacitance Cb small or (2) the area of the memory cell is increased to increase memory cell capacitance Cs. However, the former method has a problem that it is necessary to use a larger number of sense amplifiers because of the short length of the bit lines, and the latter method has a problem that the entire area of the memory chip is increased, making it difficult to enhance the integration density of the memory.

In order to solve the above problems, there has been proposed a so-called shared sense amplifier system in which a plurality of bit line pairs share the same sense amplifier. Such a shared sense amplifier system is disclosed in "ISSCC '79 technical digest", pp. 146-147, 1979 by Ilbok et al and Japanese Patent Publication No. 62-55234. For example, as shown in FIG. 7, two bit line pairs (BL$_1$, $\overline{BL_1}$) and (BL$_2$, $\overline{BL_2}$) share sense amplifier SA and one of the bit line pairs is selected by bit line selection clock signals ($\phi 1$, $\phi 2$) and selectively connected to the sense amplifier.

In the shared sense amplifier system, the sense amplifier is commonly used for a plurality of bit line pairs so that the number of sense amplifiers and the total length of the bit lines can be suppressed to a minimum. As a result, bit line capacitance Cb can be reduced and Cb/Cs can be set to be smaller, thereby making it possible to reduce the power consumption and attain a high speed access operation.

In order to meet the requirement of attaining the high speed access operation and low power consumption, a Vcc/2 precharge system in which the paired bit lines are precharged to a voltage level equal to half the Vcc power source voltage is mainly used. In this case, in order to sense the potential of approx. Vcc/2 at a high sensitivity and latch data of the bit line at high speed, a sense amplifier of CMOS construction (formed of a P-channel sense amplifier constituted by a P-channel transistor and an N-channel sense amplifier constituted by an N-channel transistor) is often used.

However, in order to transfer the signal at the high level Vcc, amplified by the sense amplifier, to the bit line, it is necessary to raise the voltages of the clock signals $\phi 1$ and $\phi 2$ supplied to the switching transistors Tn$_1$ and Tn$_2$ to a level higher than Vcc+V$_T$, and the control circuit is inevitably complex.

As is disclosed by Fujii et al. in IE$^3$ J. Solid-State Circuits, Vol. SC-21, No. 5, October 1986, a CMOS sense amplifier is known which has the structure illustrated in FIG. 7B and in which a transfer gate (or a resistor), which is always on, is connected between the N-channel SA and the P-channel SA, so that the CMOS sense amplifier has a sufficiently high sensitivity. This transfer gate can be used also as a switching transistor, in which case the adjacent memory-cell arrays share the N-channel SA only as is illustrated in FIG. 8. In this case, it is necessary to use two P-channel sense amplifiers SP$_1$ and SP$_2$ in correspondence with two bit line pairs (BL$_1$, $\overline{BL_1}$) and (BL$_2$, $\overline{BL_2}$) and commonly use a single N-channel sense amplifier SN. With this arrangement, the area performance cannot be significantly improved and the chip area cannot be reduced in comparison with the case where the shared sense amplifier system is not used and two P-channel sense amplifiers and two N-channel sense amplifiers are used for two bit line pairs.

SUMMARY OF THE INVENTION

An object of this invention is to provide a dynamic memory which utilizes the shared sense amplifier system and in which the circuit area can be reduced and the operation speed of the sense amplifier can be enhanced.

A dynamic memory device utilizing the shared sense amplifier system comprises a plurality of memory cell arrays (MC$_1$, MC$_2$, - - - ) divided in a row direction; N-channel sense amplifiers (SN$_1$, SN$_2$, - - - ) disposed in every other portions between the plurality of memory cell arrays (MC$_1$, MC$_2$, - - - ); P-channel sense amplifiers (SP$_1$, SP$_2$, - - - ) arranged alternately with the N-channel sense amplifiers (SN$_1$, SN$_2$, - - - ) and disposed in every other portions between the plurality of memory cell arrays (MC$_1$, MC$_2$, - - - ); bit line pairs (BL$_1$, $\overline{BL_1}$, BL$_2$, $\overline{BL_2}$, - - - ) for connecting the memory cell arrays (MC$_1$, MC$_2$, - - - ) to the N-channel and P-channel sense amplifiers (SN$_1$, SN$_2$, SP$_1$, SP$_2$, - - - ); and switching transistors (Tn1, Tn1*, Tp1, Tp1*, Tn2, Tn2*, Tp2, Tp2*, - - - ) connected between the plurality of memory cell arrays (MC$_1$, MC$_2$, - - - ) and the N-channel sense amplifiers (SN$_1$, SN$_2$, - - - ) and between the plurality of memory cell arrays (MC$_1$, MC$_2$, - - - ) and the P-channel sense amplifiers (SP$_1$, SP$_2$, - - - ), the gates of the switching transistors (Tn1, Tn1*, Tp1, Tp1*, Tn2, Tn2*, Tp2, Tp2*, - - - ) being supplied with control signals ($\phi 0$, $\overline{\phi 0}$, $\phi 1$, $\overline{\phi 1}$, - - - ) for separating a selected one (MCn) of said plurality of memory cell arrays (MC1, MC2, ... ) from other said plurality of memory cell arrays (MC1, MC2, ... ).

As described above, the semiconductor memory device of this invention is formed of the shared sense amplifier system in which two bit line pairs share each sense amplifier, and the N-channel sense amplifiers and the P-channel sense amplifiers are arranged separately from each other, alternately disposed between the memory cell arrays and electrically connected to each other in order to reduce the circuit area. That is, the memory cell arrays (MC$_1$, MC$_2$, - - - ) and the sense amplifiers (SN$_1$, SP$_1$, - - - ) are continuously connected via switching transistors (Tn1, Tn1*, Tp1, Tp1*, - - - ) without interruption so that the occupied area can be reduced.

Further, as another effect of this invention, the operation time of the sense amplifier is shortened by the resistance components of the switching transistors (Tn1, Tn1*, Tp1, Tp1*, - - - ) connected between each of the sense amplifiers and the memory cell arrays (MC$_1$, MC$_2$, - - - ). That is, after the sense amplifiers (SN$_1$, SP$_1$, - - - ) have detected the potential difference of the memory cell arrays (MC$_1$, MC$_2$, - - - ), the sense amplifiers set the detected voltage to a preset potential. In this case, as the capacitance of a portion whose potential is set to be determined becomes smaller, the operation time of the sense amplifier becomes shorter and the operation speed of the sense amplifier can be enhanced. In the dynamic memory of this invention, a difference in the electrical response speed is caused between the the peripheral area of the sense amplifier and the memory cell array by the presence of resistance components of the switching transistors connected in the memory. Therefore, the potential of a relatively narrow area at the periphery of the sense amplifier surrounded by the four switching transistors can be determined prior to the determination of the potential of the memory cell array. As a result, the operation speed of the sense amplifier can be enhanced.

BRIEF DESCRIPTION OF THE DRAWINGS

FIGS. 7A to 7B are a circuit diagram of the peripheral portion of the sense amplifier of a dynamic memory to which this invention is not applied;

DETAILED DESCRIPTION OF THE PREFERRED EMBODIMENTS

There will now be described an embodiment of this invention in detail with reference to the accompanying drawings.

Figure 1:
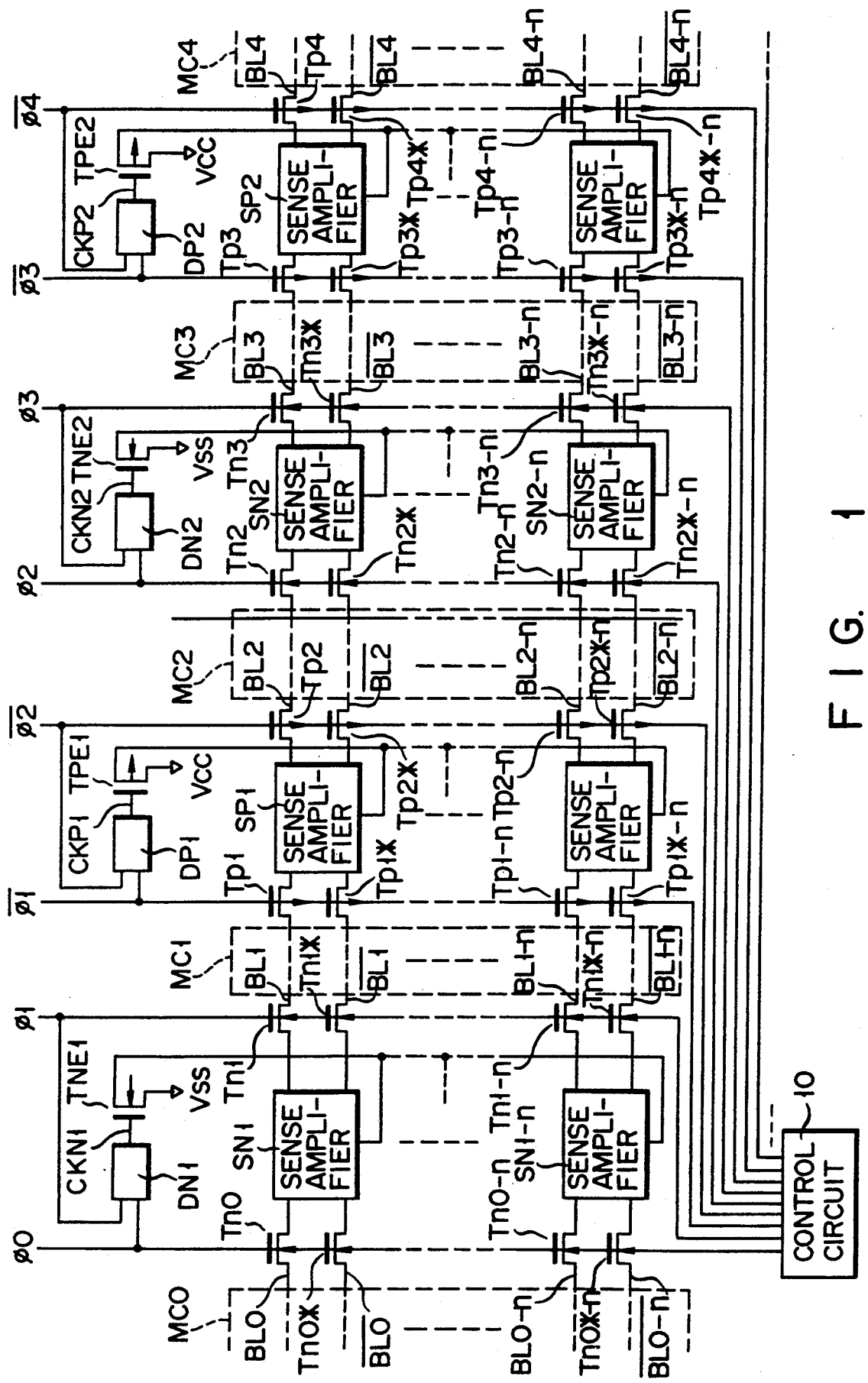
FIG. 1 is a circuit diagram showing part of a dynamic memory according to one embodiment of this invention.

FIG. 1 shows part of a dynamic memory according to one embodiment of this invention. In FIG. 1, MC$_0$, MC$_1$, - - - denote memory cell blocks formed by dividing a memory cell array in a row direction; SP$_1$, SP$_2$, - - - denote P-channel sense amplifiers formed of P-channel transistors; and SN$_1$, SN$_2$, - - - denote N-channel sense amplifiers formed of N-channel transistors.

Figure 2A:
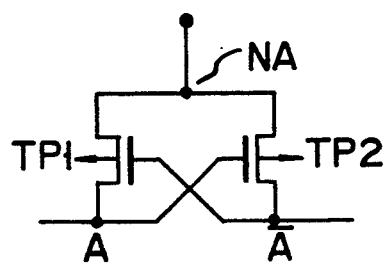
FIG. 2A is a circuit diagram of a P-channel sense amplifier used in the embodiment of FIG. 1.

As shown in FIG. 2A, each of P-channel sense amplifiers SP$_1$, SP$_2$, - - - is formed of a cross-coupled type sense amplifier including two P-channel MOS transistors TP1 and TP2 whose sources are connected together. The gate and drain of P-channel MOS transistor TP1 are respectively connected to the drain and gate of P-channel MOS transistor TP2 and the drains of P-channel MOS transistors TP1 and TP2 are respectively connected to first and second sense nodes $\overline{A}$ and A.

Figure 2B:
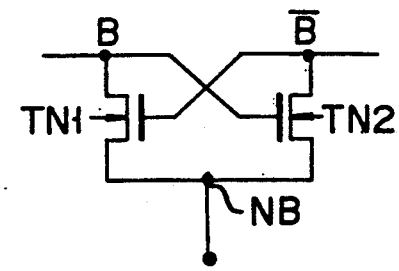
FIG. 2B is a circuit diagram of an N-channel sense amplifier used in the embodiment of FIG. 1.

As shown in FIG. 2B, each of N-channel sense amplifiers SN$_1$, SN$_2$, - - - is formed of a cross-coupled type sense amplifier including two N-channel MOS transistors TN1 and TN2 whose sources are connected together. The gate and drain of N-channel MOS transistor TN1 are respectively connected to the drain and gate of N-channel MOS transistor TN2 and the drains of N-channel MOS transistors TN1 and TN2 are respectively connected to first and second sense nodes B and $\overline{B}$.

The paired sense nodes (first and second sense nodes B and $\overline{B}$) of N-channel sense amplifiers SN$_1$, SN$_2$, - - - are respectively connected to the paired bit lines (two complementary bit lines) via paired N-channel switching transistors. In this case, two pairs of bit lines are connected to the paired sense nodes of one sense amplifier via two pairs of switching transistors, and the two pairs of bit lines are formed to extend in both directions (in opposite directions) of the above sense amplifier.

That is, first sense node B of sense amplifier SN$_1$ is connected to one end of each of bit lines BL$_0$ and BL$_1$ via a corresponding one of switching transistors Tn0 and Tn1, and second node $\overline{B}$ of sense amplifier SN$_1$ is connected to one end of each of bit lines $\overline{BL_0}$ and $\overline{BL_1}$ which are complementary to bit lines BL$_0$ and BL$_1$ via a corresponding one of switching transistors Tn0* and Tn1*. One pair of transistors (Tn0, Tn0*) or (Tn1, Tn1*) in the two pairs of switching transistors are selectively driven by the bit selection clock signal so that one of two pairs of bit lines (BL$_0$, $\overline{BL_0}$) and (BL$_1$, $\overline{BL_1}$) which is provided in a memory cell block to be accessed in a readout cycle, write-in cycle or refresh cycle can be selectively connected to sense amplifier SN$_1$.

Like sense amplifier SN$_1$, sense amplifier SN$_2$ is connected to two pairs of the bit lines (BL$_2$, $\overline{BL_2}$) and (BL$_3$, $\overline{BL_3}$) via two pairs of switching transistors (Tn2, Tn2*) and (Tn3, Tn3*) which are selectively driven. The other end of each of the paired bit lines (BL$_1$, $\overline{BL_1}$) is connected to a corresponding one of the sense nodes (A, $\overline{A}$) of P-channel sense amplifier SP$_A$ via one of the P-channel switching transistors (Tp1, Tp1*). The paired sense nodes are further connected to the other end of another pair of the bit lines (BL$_2$, $\overline{BL_2}$) via another pair of the P-channel switching transistors (Tp2, Tp2*).

Like sense amplifier SP$_1$, sense amplifier SP$_2$ is connected to two pairs of the bit lines (BL$_3$, $\overline{BL_3}$) and (BL$_4$, $\overline{BL_4}$) via two pairs of the switching transistors (Tp3, Tp3*) and (Tp4, Tp4*) which are selectively driven. As described above, the P-channel and N-channel sense amplifiers are alternately arranged in each memory cell block.

Each pair of the switching transistors (Tn0, Tn0*) and (Tn1, Tn1*); (Tp1, Tp1*) and (Tp2, Tp2*); (Tn2, Tn2*) and (Tn3, Tn3*); and (Tp3, Tp3*) and (Tp4, Tp4*) are selectively driven by at least one of bit line selection clock signals $\phi 0$, $\overline{\phi 0}$, $\phi 1$, $\phi 2$, $\overline{\phi 2}$, $\phi 3$, $\overline{\phi 3}$, $\phi 4$, - - - which is set active in response to an address used for selecting one of bit lines connected to the respective transistor pairs.

Bit line selection clock signals $\phi 0$, $\overline{\phi 0}$, $\phi 1$, $\overline{\phi 1}$, - - - are supplied to the gates of the respective switching transistors (Tn1, Tn1*; Tp1, Tp1*; Tn2, Tn2*; Tp2, Tp2*; - - - ). Only four transistors surrounding a sense amplifier which is selected in the memory operation are turned on, and the other transistors are kept turned off. With this construction, only the selected sense amplifier may function, and the other memory cell arrays or bit lines are electrically isolated. Bit line selection clock signals $\overline{\phi 0}$, $\phi 1$, $\overline{\phi 1}$, - - - are supplied from control circuit 10 shown in FIG. 1.

Figure 11:
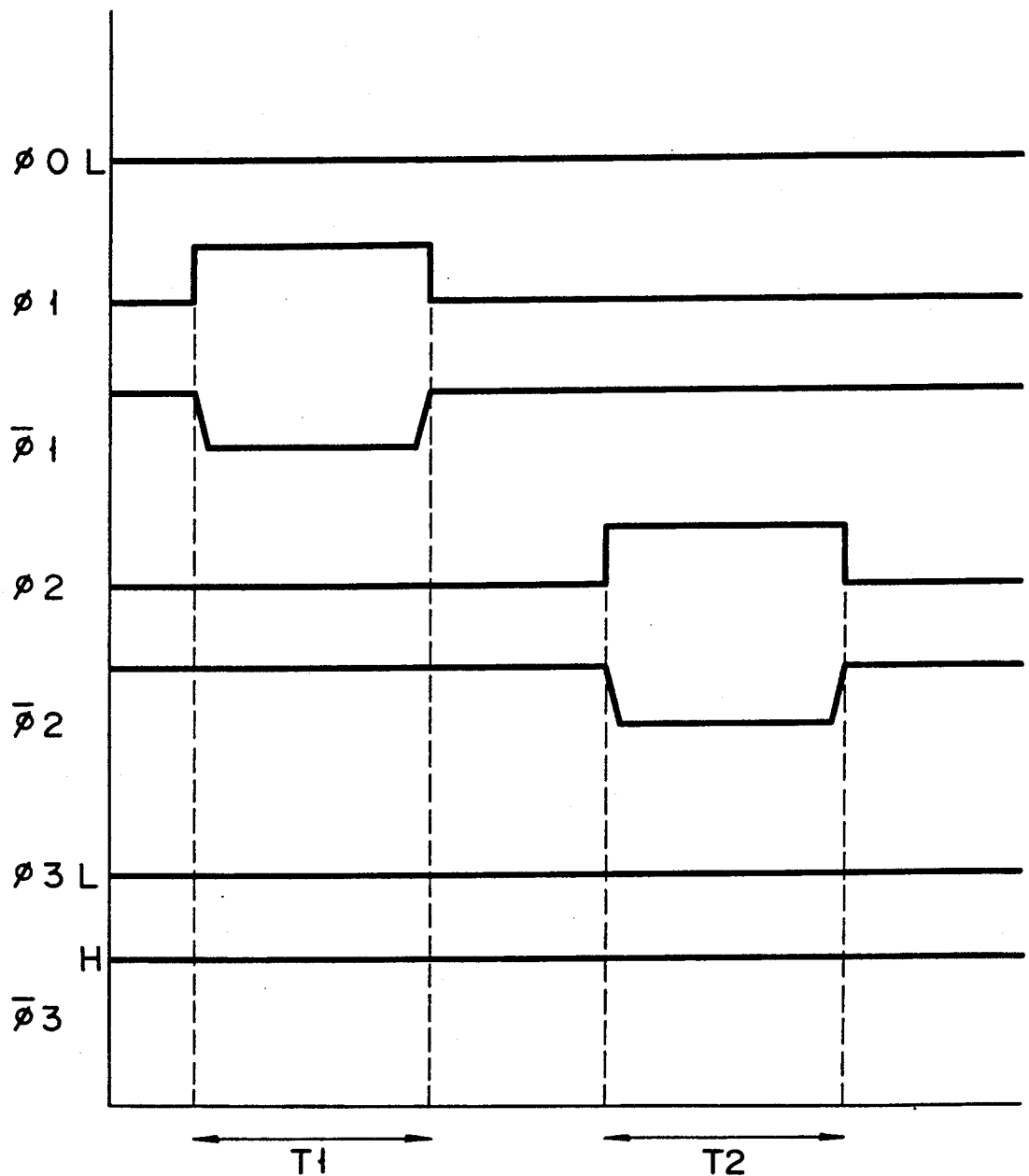
FIG. 11 is a timing chart illustrating the timings of bit line selection clock signals used for selection of the bit lines used in the dynamic memory of this invention.

The above operating conditions are shown in FIG. 11. In FIG. 11, T2 denotes a period in which sense amplifier SN1 is selected, and T2 denotes a period in which sense amplifier SP1 is selected.

P-channel transistor TPE1 for activation control is connected between a Vcc voltage node and the source common node (NA in FIG. 2A) of two P-channel transistors TP1 and TP2 for each of P-channel sense amplifiers $SP_1$ and $SP_2$. P-channel transistor TPE1 is driven by clock signal CKP1 which is obtained by delaying bit line selection clock signals $\overline{\phi 1}$ and $\phi 2$ for selectively driving the two pairs of switching transistors (Tp1, Tp1*; Tp2, Tp2*) corresponding to P-channel sense amplifier $SP_1$ by preset delay time gp by means of delay circuit DP1.

N-channel transistor TNE1 for activation control is connected between a Vss voltage node and the source common node (NB in FIG. 2B) of two N-channel transistors TN1 and TN2 for each of N-channel sense amplifiers $SN_1$ and $SN_2$. N-channel transistor TNE1 is driven by clock signal CKN1 which is obtained by delaying bit line selection clock signals $\phi 0$ and $\phi 1$ for selectively driving the two pairs of switching transistors (Tn0, Tn0*; Tn1, Tn1*) corresponding to N-channel sense amplifier $SN_1$ by preset delay time tn by means of delay circuit DN1.

Therefore, each sense amplifier (for example, $SN_1$) is activated the preset delay time $\tau n$ after one (for example, Tn0, Tn0*) of two pairs of switching transistors (for example, Tn0, Tn0*; Tn1, Tn1*) connected to the sense amplifier has been selected.

Figure 3:
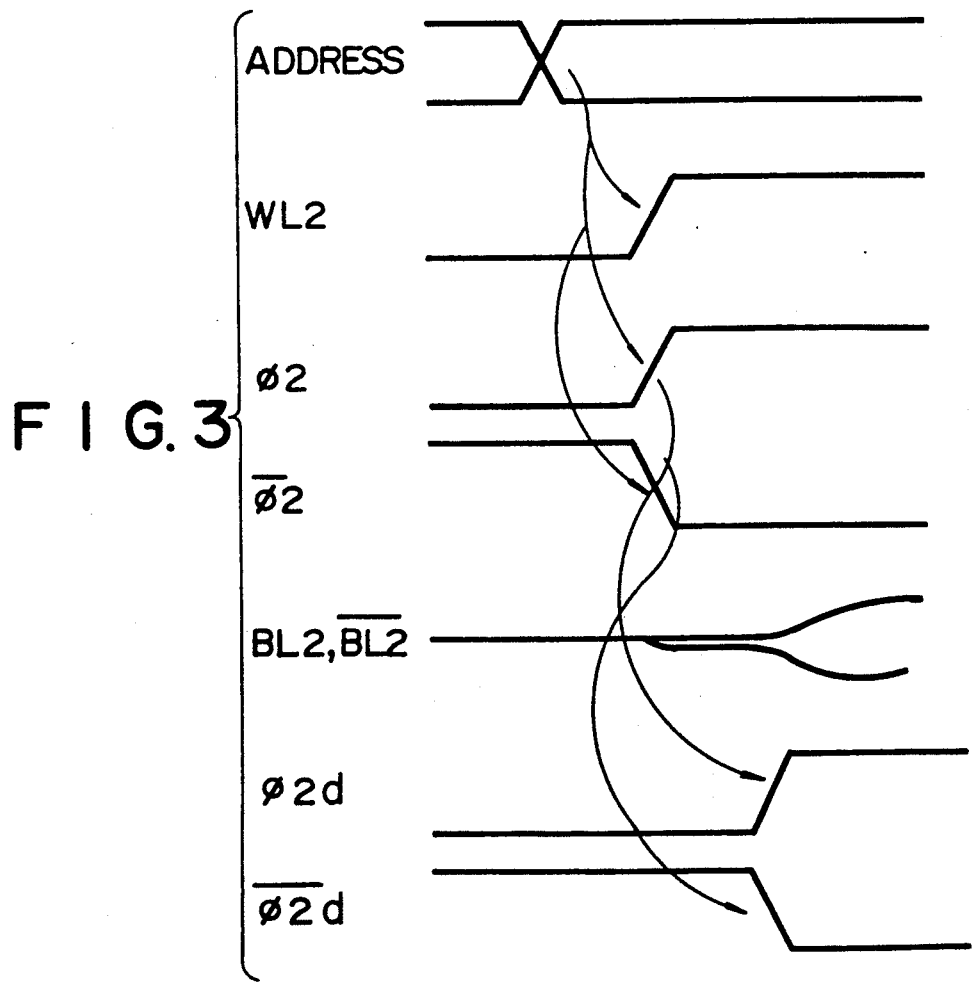
FIG. 3 is a waveform diagram illustrating the operation of the memory shown in FIG. 1.

Now, the operation of the dynamic memory is explained with reference to the waveform diagram shown in FIG. 3. Suppose that a row address is input and decoded to activate word line WL2 formed in one (for example, $MC_2$) of the memory cell blocks divided in the column direction. At the same time of activation of word line WL2, bit line selection clock signals $\phi 2$ and $\overline{\phi 2}$ are activated in response to the row address to connect the pair of bit lines ($BL_2$ and $\overline{BL_2}$) to sense amplifiers $SN_2$ and $SP_1$.

When memory cell data is read out and supplied to the pair of bit lines ($BL_2$ and $\overline{BL_2}$) and the potential difference between the paired bit lines ($BL_2$ and $\overline{BL_2}$) has reached a level which sense amplifier $SN_2$ or $SP_1$ can sense, sense amplifier $SN_2$ or $SP_1$ is selectively activated by clock signals $\phi 2d$ and $\overline{\phi 2d}$. Clock signals $\phi 2d$ abd $\overline{\phi 2d}$ used in this case are clock signals (which are the same as clock signals CKP1 and CKN1 in FIG. 1) which are obtained by delaying bit line selection clock signals $\phi 2$ and $\overline{\phi 2}$ by delay times $\tau n$ and $\tau p$. Delay times $\tau n$ and $\tau p$ correspond to time which is required for the potential difference between the paired bit lines ($BL_2$ and $\overline{BL_2}$) to reach a level which is large enough to be sensed by the sense amplifier.

According to the dynamic type sense amplifier of this embodiment, since the CMOS sense amplifier is used, the low power consumption and high access speed can be attained. Further, since the shared sense amplifier system is used, data can be sensed at a high sensitivity. In addition, since two pairs of bit lines share one sense amplifier, the area of the sense amplifier can be reduced to ½ in comparison with the case where the shared sense amplifier system is not used. Further, since the N-channel and P-channel sense amplifiers are alternately arranged between the memory cell blocks divided in the column direction and two pairs of bit lines share one sense amplifier, the chip area can be significantly reduced in comparison with the case where CMOS sense amplifiers of the conventional shared sense amplifier system in which two P-channel sense amplifiers and one N-channel sense amplifier are used for the two pairs of bit lines are used.

In an ordinary memory, each column is divided into a large number of column portions and the number of divided portions increases with an increase in the capacitance of the memory. Therefore, as described above, the chip area can be greatly reduced by decreasing the area of the sense amplifier. In other words, additional sense amplifiers can be formed in an area created by reducing the area of the sense amplifiers so as to increase the total number of sense amplifiers and the number of divided portions of the bit line pair. As a result, the total bit line length can be further reduced and bit line capacitance Cb can be suppressed to a minimum. Thus, the ratio of Cb/Cs can be reduced and the sensitivity of the sense amplifier can be further enhanced without increasing memory cell capacitance Cs.

Figure 4:
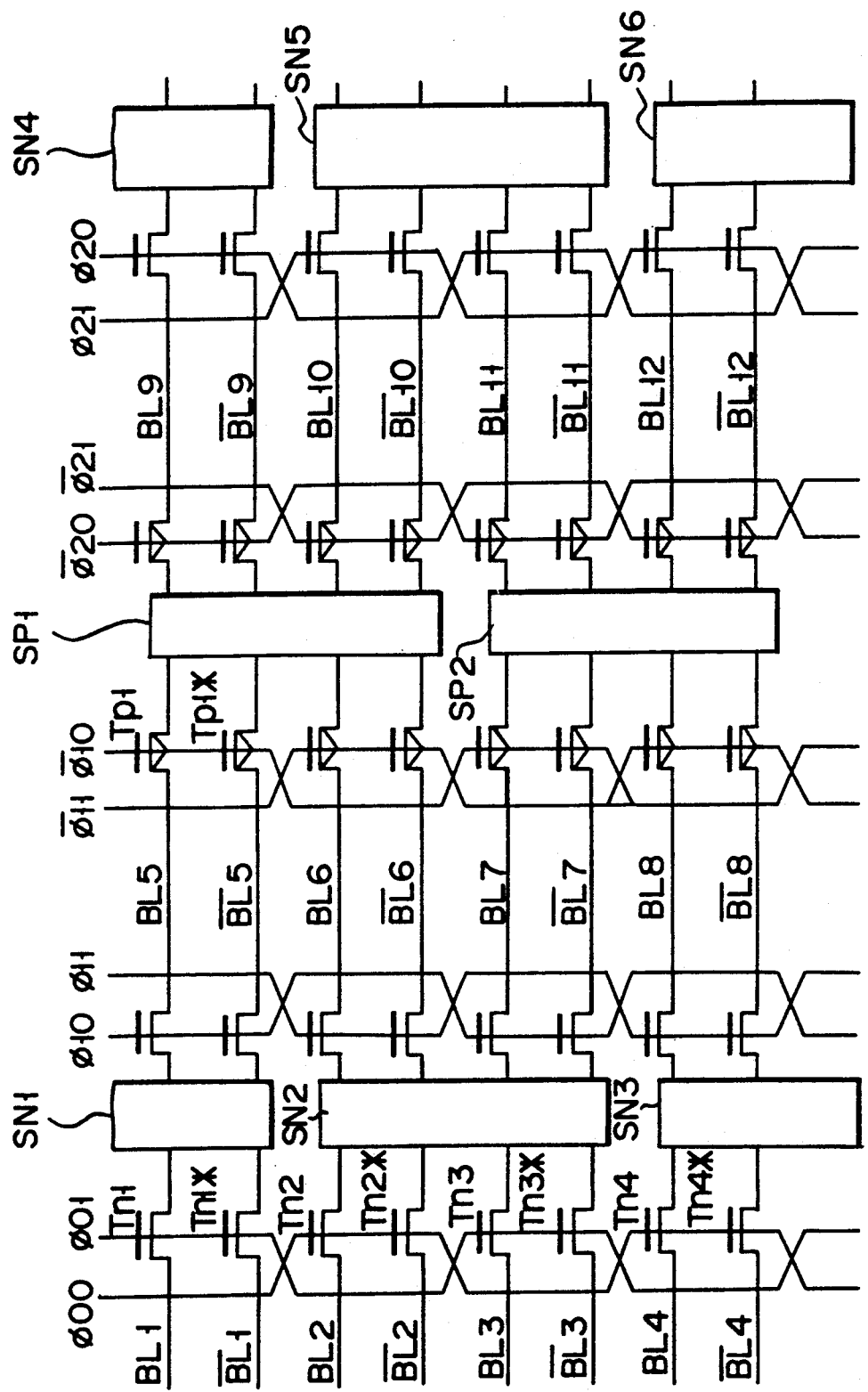
FIG. 4 is a circuit diagram showing part of a dynamic memory according to another embodiment of this invention.

FIG. 4 shows part of a dynamic memory according to another embodiment of this invention. This embodiment is similar to the embodiment of FIG. 1 except that the transistors for controlling the activation of the sense amplifiers and the delay circuit for delaying bit line selection clock signals to selectively drive the transistors are not shown, four pairs of bit lines are connected to to the pairs of sense nodes of sense amplifiers $SP_1$, $SP_2$, - - - , $SN_1$, $SN_2$, - - - via four pairs of switching transistors, and the four pairs of bit lines share each sense amplifier. Two of the four pairs of bit lines are formed to extend in both directions (opposite directions) of the sense amplifier to constitute a column. Four sets of bit line selection clock signals are prepared for each sense amplifier and one transistor pair of the four sets of switching transistors are driven so as to supply one of the four sets of bit line selection clock signals used for access to the sense amplifier.

In this case, since the number of bit line pairs sharing each sense amplifier is doubled, the chip area can be further reduced in comparison with the former embodiment.

In FIG. 4, Tn1, Tn1*, - - - , Tp1, Tp1*, - - - denote switching transistors, BL1, $\overline{BL1}$, - - - denote bit line pairs, and $\phi 00$, $\phi 01$, - - - denote bit line selection clock signals.

Figure 5:
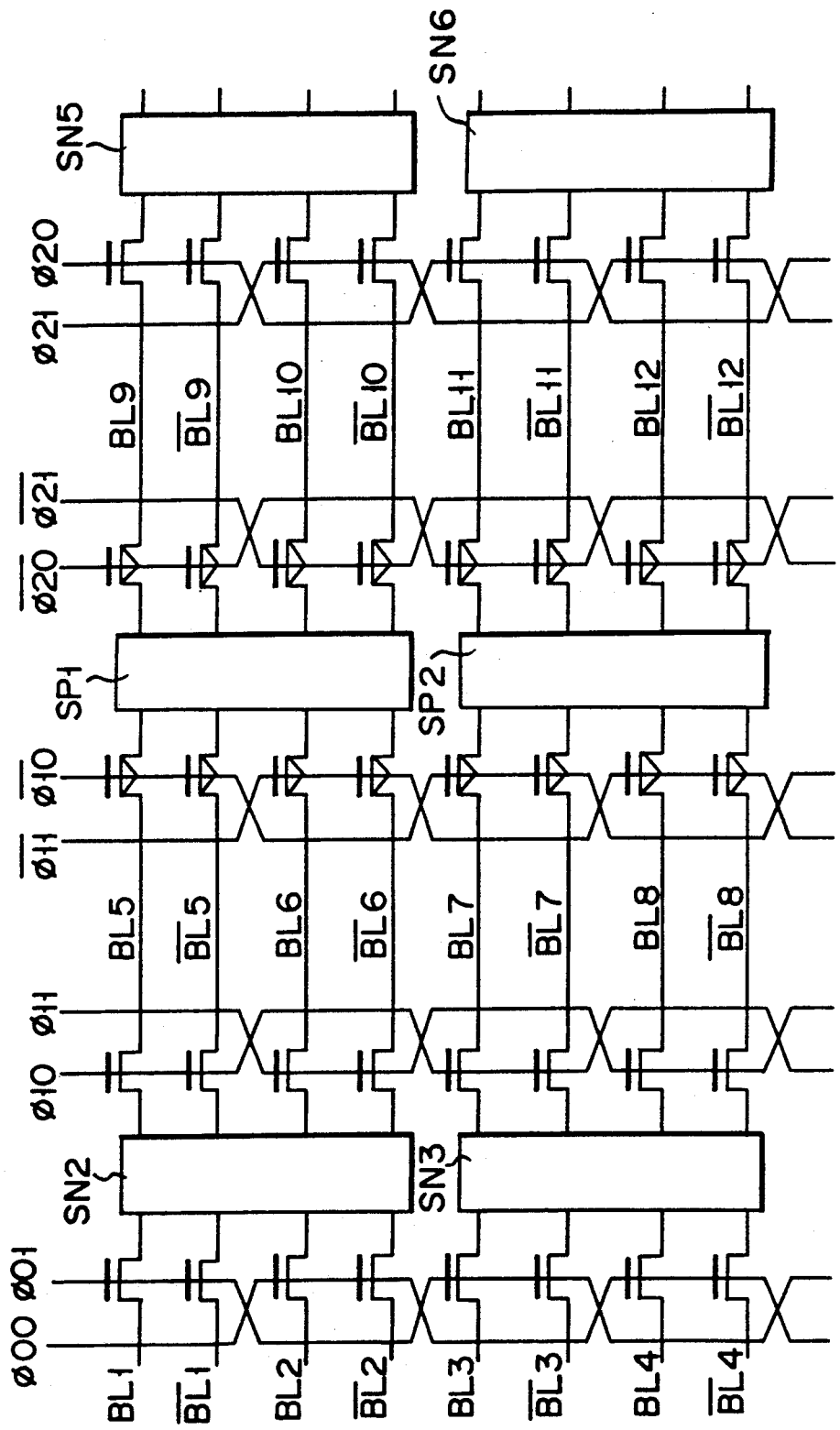
FIG. 5 is a circuit diagram showing part of a dynamic memory according to still another embodiment of this invention.
Figure 6:
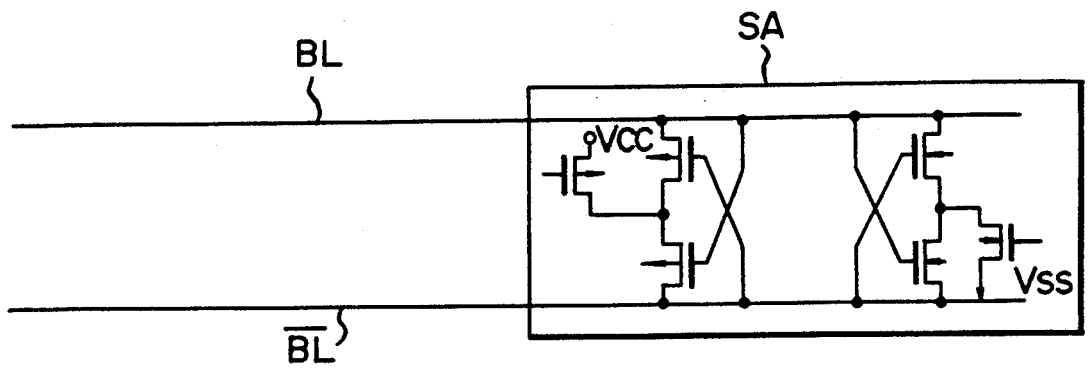
FIG. 6 is a circuit diagram of the sense amplifier of a dynamic memory to which this invention is not applied.
Figure 7A:
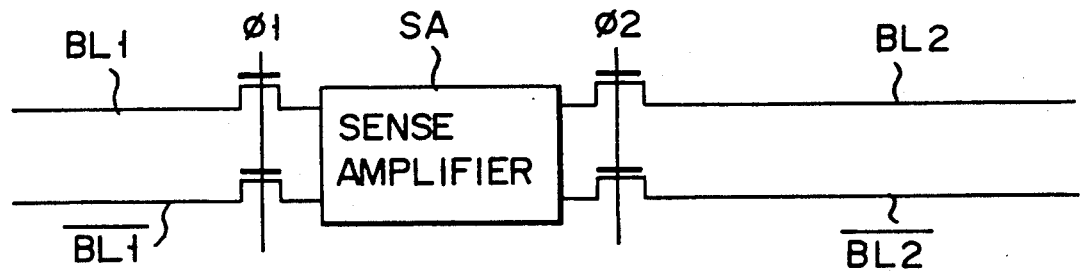
Figure 8:
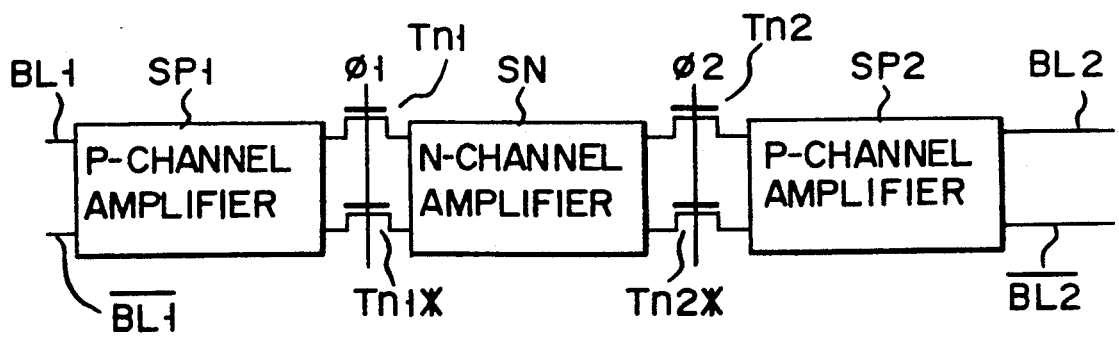
FIG. 8 is a circuit diagram of part of a dynamic memory to which this invention is not applied.

FIG. 5 shows part of a modification of the dynamic memory of FIG. 4. In the modification of FIG. 5, sense amplifiers $SP_1$, $SP_2$, - - - , $SN_1$, $SN_2$, - - - in the dynamic memory of FIG. 4 are displaced by a half pitch (corresponding to an area of one pair of bit lines) in a direction perpendicular to the bit line pair, and four pairs of switching transistors and four pairs of bit lines which are different from the four pairs of switching transistors and four pairs of bit lines of the dynamic memory of FIG. 4 and are displaced by a half pitch from the four pairs of switching transistors and four pairs of bit lines of the dynamic memory of FIG. 4 are provided for each sense amplifier.

It is also possible to use a larger number of bit line pairs so as to share each sense amplifier via corresponding switching transistors.

In a case where four or more pairs of bit lines share each sense amplifier, the chip area can be further significantly reduced by reducing the area of the sense amplifier in comparison with the dynamic memory of FIG. 4. If the transistors of the sense amplifier are formed with a larger size by utilizing an available portion of the chip area created by reducing the area of the sense amplifier, it becomes possible to attain a high operation speed of the memory and a high sensitivity of the sense amplifier.

Figure 9:
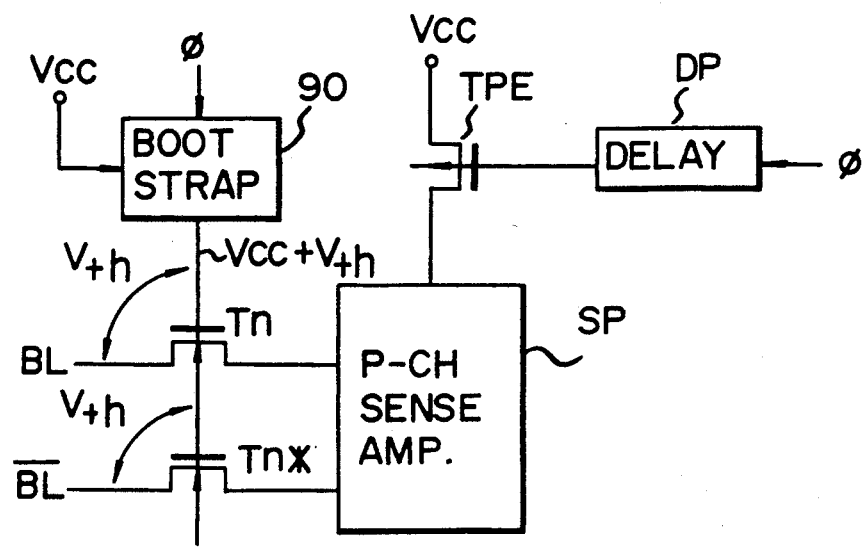
FIGS. 9 and 10 are circuit diagrams of an embodiment of this invention which includes a bootstrap circuit for control signals supplied to active transistors of the sense amplifier.

Further, in a case where the switching transistor pair is formed of N-channel transistors, the bit line selection clock signal supplied to the gates of those of the N-channel transistors which are connected to the paired sense nodes of the P-channel sense amplifier can be stepped up to a voltage level (Vcc+Vth) higher than power source voltage Vcc by the gate threshold voltage (Vth) of the N-channel transistors (Tn, Tn*) by means of bootstrap circuit 90 shown in FIG. 9. With the above bootstrap operation, a voltage drop corresponding to the gate threshold voltage (Vth) of the N-channel transistor can be prevented from occurring in the input voltage of P-channel sense amplifier SP.

Figure 10:
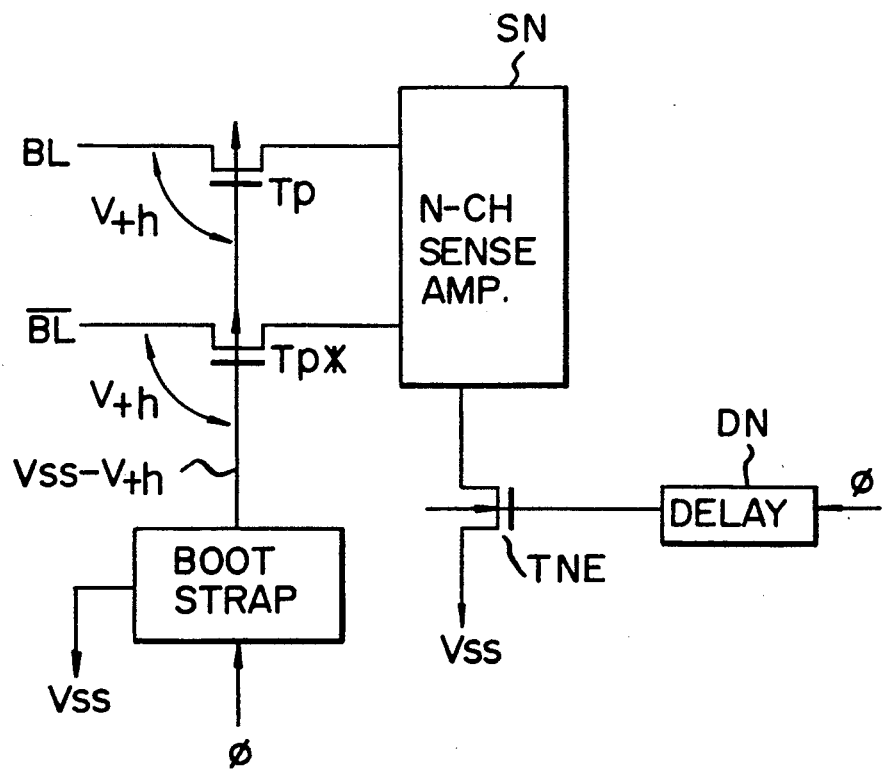

In contrast, in a case where the paired switching transistors are formed of P-channel transistors, the bit line selection clock signal supplied to the gate of those of the P-channel transistors which are connected to the paired sense nodes of the N-channel sense amplifier can be stepped down to a negative voltage level (increased in its absolute value) lower than ground potential Vss by the gate threshold voltage (Vth) of the P-channel transistors (Tp, Tp*) by means of bootstrap circuit 100 shown in FIG. 10. With the above bootstrap operation, a voltage drop corresponding to the gate threshold voltage (Vth) of the P-channel transistor can be prevented from occurring in the input voltage of N-channel sense amplifier SN.

As described above, the semiconductor memory device including the shared type sense amplifier of this invention is constructed such that the memory cell arrays (MC1, MC2, - - -) and sense amplifiers (SN1, SP1, - - -) are connected via the switching transistors (Tn1, Tn1*, Tp1, Tp1*, - - -) and continuously arranged on a row. Therefore, the entire area can be reduced, permitting the size of the semiconductor memory device to be reduced.

Further, as another effect, the potential of a relatively small area around the sense amplifier surrounded by four switching transistors (Tn1, Tn1*, Tp1, Tp1*, - - -) can be determined prior to the determination of the potential of the memory cell because there occurs a difference in the electrical response speed between the area around the sense amplifier and the memory cell array by the resistance components of the switching transistors connected in the dynamic memory of this invention. As a result, the operation speed of the sense amplifier can be enhanced.

What is claimed is:

1. A semiconductor memory device comprising:
   first blocks of memory cells;
   second blocks of memory cells connected to said first blocks of memory cells;
   third blocks of memory cells connected to said second blocks of memory cells;
   first sense amplifiers formed of N-channel transistors, connected between said first blocks of memory cells and said second blocks of memory cells;
   second sense amplifiers formed of P-channel transistors, connected between said second blocks of memory cells and said third blocks of memory cells;
   first switching means for separating electrically a selected one of said first blocks of memory cells in response to a first signal applied thereto, said first switching means connected between said first blocks and said first sense amplifiers;
   second switching means for separating electrically a selected one of said second blocks of memory cells in response to a second signal applied thereto, said second switching means connected between said first sense amplifiers and said second blocks of memory cells;
   third switching means for separating electrically a selected one of said second blocks of memory cells in response to a third signal applied thereto, said third switching means connected between said second blocks of memory cells and said second sense amplifiers; and
   fourth switching means for separating electrically a selected one of said third blocks of memory cells in response to a fourth signal applied thereto, said fourth switching means connected between said second sense amplifiers and said third blocks of memory cells.

2. A semiconductor memory device according to claim 1, wherein said first sense amplifiers include a pair of N-channel transistors, a gate of a first transistor of said pair of N-channel transistors is connected to a drain of a second transistor of said pair of N-channel transistors, and a gate of said second transistor of said pair of N-channel transistors is connected to a drain of said first transistor of said pair of N-channel transistors.

3. A semiconductor memory device according to claim 1, wherein said first sense amplifiers include a pair of P-channel transistors, a gate of a first transistor of said pair of P-channel transistors is connected to a drain of a second transistor of said pair of P-channel transistors, and a gate of said second transistor of said pair of P-channel transistors is connected to a drain of said first transistor of said pair of P-channel transistors.

4. A semiconductor memory device according to claim 1, further comprising:
   a first delay circuit for supplying a timing signal, said timing signal derived from the logical sum of said first and second signals.

5. A semiconductor memory device according to claim 4, further comprising:
   a switching means for activating said sense amplifiers in response to said timing signal provided from said delay circuit.

6. A semiconductor memory device according to claim 1, further comprising:
   a delay circuit for supplying a delayed signal by delaying at least one of said first, second, third, and fourth signals to said first and second sense amplifiers to activate said first and second sense amplifiers.

7. A semiconductor memory device according to claim 6, wherein said delay circuit generates said delayed signal by the time corresponding to the time required for a level difference between paired bit lines to become larger than a value which can be sensed by a corresponding one of the sense amplifiers.

8. A semiconductor memory device according to claim 1, further comprising:
a bootstrap circuit for stepping up at least one of said first, second, third, and fourth signals by use of a first power source and then applying the stepped-up first, second, third, and fourth signals to the gates of said first, second third, and fourth switching means respectively.

9. A semiconductor memory device according to claim 1, further comprising:
a bootstrap circuit for stepping down at least one of said first, second, third, and fourth signal by use of a second power source and then supplying the stepped-down first, second, third, and fourth signal to the gates of said first, second, third, and fourth switching means respectively.

10. A semiconductor memory device comprising:
a plurality of blocks of memory cells divided in a row direction;
a plurality of sense amplifiers disposed in portions between said blocks of memory cells;
switching transistors connected between said blocks of memory cells and said plurality of sense amplifiers; and
a control circuit for supplying control signals to the gates of said switching transistors to separate a selected one of said blocks of memory cells from other said blocks of memory cells.

11. A semiconductor memory device comprising:
a plurality of rows of blocks of memory cells;
first sense amplifiers formed of a pair of N-channel transistors a gate of each N-channel transistor being connected to a drain of the other N-channel transistor, said first sense amplifiers being disposed between selected adjacent rows of blocks of memory cells;
second sense amplifiers formed of a pair of P-channel transistors, a gate of each P-channel transistors being connected to a drain of the other P-channel transistor, said second sense amplifiers being disposed between remaining adjacent rows of blocks of memory cells;
switching transistors connected between said selected rows of blocks of memory cells and said first sense amplifiers and between said remaining rows of blocks of memory cells and said second sense amplifiers; and
a control circuit for supplying control signals to the gates of said switching transistors to separate a selected one of said blocks of memory cells from other said blocks of memory cells.

12. A semiconductor memory device comprising:
a plurality of memory cells blocks divided in a row direction;
a plurality of sense amplifiers each having a pair of transistors and disposed in portions between said plurality of memory cell blocks, said plurality of sense amplifiers including delay circuits and sense amplifier activation transistors;
switching transistors connected between said plurality of memory cell blocks and said plurality of sense amplifiers; and
a control circuit for supplying control signals to said delay circuits and the gates of said switching transistors to separate a selected one of said blocks of memory cells from other said blocks of memory cells.

13. A semiconductor memory device comprising:
a plurality of memory cell blocks divided into rows;
first sense amplifiers formed of N-channel transistors and disposed between selected adjacent rows of said memory cell blocks;
second sense amplifiers formed of P-channel transistors and arranged alternately with said first sense amplifiers and disposed between remaining adjacent rows of said memory cell blocks;
switching transistors connected between said said selected rows of memory cell blocks and said plurality of the first sense amplifiers and between said said remaining rows of memory cell blocks and said plurality of the second sense amplifiers; and
a control circuit for supplying control signals to the gates of said switching transistors to separate a selected one of said blocks of memory cells from other said blocks of memory cells.

14. A dynamic memory comprising:
cross-coupled type P-channel and N-channel sense amplifiers alternately arranged in portions between a plurality of memory cell blocks divided in a column direction;
wherein said P-channel sense amplifier includes two P-channel MOS transistors whose drains are used as first and second sense nodes constituting a sense node pair and whose sources are connected to each other, the gate and drain of one of said P-channel MOS transistors being respectively connected to the drain and gate of the other MOS transistor;
wherein said N-channel sense amplifier includes two N-channel MOS transistors whose drains are used as first and second sense nodes and whose sources are connected to each other, the gate and drain of one of said N-channel MOS transistors being respectively connected to the drain and gate of the other MOS transistor;
wherein each of said memory cell blocks includes n pairs of complementary bit lines, each said pair of complementary bit lines constituting one bit line set;
wherein the first sense node of each of said sense amplifiers is connected to one end of said n pairs of complementary bit lines arranged on one side of said sense amplifier via a switching MOS transistor;
wherein the second sense node of each of said sense amplifiers is connected to one end of said n pairs of complementary bit lines arranged on one side of said sense amplifier via a switching MOS transistor; and
means for supplying selection clock signals to the gates of corresponding ones of said switching transistors and activating only the sense amplifiers connected to the switching transistors which have received the selection clock signals so as to selectively connect only a selected one of said complementary bit line pairs in one of said memory cell blocks selected in a readout cycle, write-in cycle or refresh cycle to the sense amplifiers disposed on both sides of said selected complementary bit line pair.

* * * * *